US009894809B1

(12) United States Patent
Springs et al.

(10) Patent No.: US 9,894,809 B1
(45) Date of Patent: Feb. 13, 2018

(54) SYSTEM FOR SUPPLYING COOLING AIR FROM SUB-FLOOR SPACE

(71) Applicant: Amazon Technologies, Inc., Reno, NV (US)

(72) Inventors: Charles Nakia Springs, Fairfax, VA (US); Joseph James Lindsay, Seattle, WA (US); Shelton George Gregory, Ashburn, VA (US)

(73) Assignee: Amazon Technologies, Inc., Reno, NV (US)

( * ) Notice: Subject to any disclaimer, the term of this patent is extended or adjusted under 35 U.S.C. 154(b) by 848 days.

(21) Appl. No.: 13/781,271

(22) Filed: Feb. 28, 2013

(51) Int. Cl.
 *H05K 7/20* (2006.01)
(52) U.S. Cl.
 CPC .................. *H05K 7/20745* (2013.01)
(58) Field of Classification Search
 CPC .. H05K 7/20; H05K 7/20009; H05K 7/20127; H05K 7/20136; H05K 7/20145; H05K 7/20154; H05K 7/20163; H05K 7/20172; H05K 7/20181; H05K 7/20209; H05K 7/20536; H05K 7/206; H05K 7/20609; H05K 7/20618; H05K 7/20636; H05K 7/20645; H05K 7/20654; H05K 7/207; H05K 7/20709; H05K 7/20836; H05K 7/20845; H05K 7/20863; H05K 7/2089; H05K 7/209; H05K 7/20909; H05K 7/20919; H05K 7/20945; H05K 7/20954; H05K 7/20963; H05K 7/20972; H05K 9/0041; H05K 7/20718; H05K 7/20727; H05K 7/20736; H05K 7/20745; F24F 13/06; F24F 2013/0612; F24F 13/075

USPC .......... 454/184; 361/690, 678; 239/592, 596
See application file for complete search history.

(56) References Cited

U.S. PATENT DOCUMENTS

| 3,481,485 A | 12/1969 | Hess |
| 3,807,572 A | 4/1974 | Luvara et al. |
| 3,834,423 A | 9/1974 | Elson |
| 3,915,477 A | 10/1975 | Timmons |
| 4,082,092 A | 4/1978 | Foster |
| 4,328,897 A | 5/1982 | Weiss |
| 4,448,111 A | 5/1984 | Doherty |

(Continued)

FOREIGN PATENT DOCUMENTS

| EP | 0 546 211 | 6/1993 |
| EP | 0741269 | 11/1996 |

(Continued)

OTHER PUBLICATIONS

U.S. Appl. No. 12/751,212, filed Mar. 31, 2010, Michael P. Czamara.

(Continued)

*Primary Examiner* — Steven B McAllister
*Assistant Examiner* — Ko-Wei Lin
(74) *Attorney, Agent, or Firm* — Robert C. Kowert; Meyertons, Hood, Kivlin, Kowert & Goetzel, P.C.

(57) ABSTRACT

A system for providing air to electrical systems includes a conduit having a passageway, an inlet portion, and one or more exits. The conduit may couple with an opening in the raised floor. The inlet portion of the conduit may receive air from the sub-floor space and pass the air to the passageway. The exits may direct air from the passageway through rack air inlets of a rack computing system.

24 Claims, 7 Drawing Sheets

(56) References Cited

U.S. PATENT DOCUMENTS

| | | | |
|---|---|---|---|
| 4,585,122 A | 4/1986 | Stegenga | |
| 4,864,469 A | 9/1989 | Boudon | |
| 4,926,291 A | 5/1990 | Sarraf | |
| 5,208,722 A | 5/1993 | Ryan et al. | |
| 5,294,049 A | 3/1994 | Trunkle et al. | |
| 5,412,534 A | 5/1995 | Cutts et al. | |
| 5,473,507 A | 12/1995 | Schwegler et al. | |
| 5,506,750 A | 4/1996 | Carteau et al. | |
| 5,518,277 A | 5/1996 | Sanders | |
| 5,621,890 A | 4/1997 | Notarianni et al. | |
| 5,644,472 A | 7/1997 | Klein | |
| 5,682,289 A | 10/1997 | Schwegler et al. | |
| 5,751,549 A | 5/1998 | Eberhardt et al. | |
| 5,772,500 A | 6/1998 | Harvey et al. | |
| 5,796,580 A | 8/1998 | Komatsu et al. | |
| 5,806,438 A | 9/1998 | Beaudet | |
| 5,822,184 A | 10/1998 | Rabinovitz | |
| 5,843,131 A | 12/1998 | McDonough | |
| 5,871,396 A | 2/1999 | Shen | |
| 6,031,717 A | 2/2000 | Baddour et al. | |
| 6,039,190 A | 3/2000 | Clausen | |
| 6,141,986 A | 11/2000 | Koplin | |
| 6,159,092 A * | 12/2000 | Elder | B60H 1/3421 454/152 |
| 6,166,917 A | 12/2000 | Anderson | |
| 6,259,605 B1 | 7/2001 | Schmitt | |
| 6,364,009 B1 | 4/2002 | MacManus et al. | |
| 6,425,417 B1 | 7/2002 | Paschke | |
| 6,456,498 B1 | 9/2002 | Larson et al. | |
| 6,459,579 B1 | 10/2002 | Farmer et al. | |
| 6,469,899 B2 | 10/2002 | Hastings et al. | |
| 6,496,366 B1 | 12/2002 | Coglitore et al. | |
| 6,499,609 B2 | 12/2002 | Patriche et al. | |
| 6,525,936 B2 | 2/2003 | Beitelmal et al. | |
| 6,563,704 B2 | 5/2003 | Grouell et al. | |
| 6,590,768 B1 | 7/2003 | Wiley | |
| 6,603,661 B2 | 8/2003 | Smith et al. | |
| 6,616,524 B2 * | 9/2003 | Storck, Jr. | F24F 7/06 361/678 |
| 6,621,693 B1 | 9/2003 | Potter et al. | |
| 6,625,020 B1 | 9/2003 | Hanson et al. | |
| 6,650,535 B1 | 11/2003 | Moss et al. | |
| 6,725,132 B2 | 4/2004 | Frankel et al. | |
| 6,754,082 B1 | 6/2004 | Ding et al. | |
| 6,767,280 B1 | 7/2004 | Berger | |
| 6,775,137 B2 * | 8/2004 | Chu | H05K 7/20754 165/120 |
| 6,791,836 B2 | 9/2004 | Cipolla et al. | |
| 6,795,314 B1 | 9/2004 | Arbogast et al. | |
| 6,804,123 B1 | 10/2004 | Cheng | |
| 6,819,567 B2 | 11/2004 | Baker et al. | |
| 6,833,995 B1 | 12/2004 | Hsue et al. | |
| 6,859,366 B2 | 2/2005 | Fink et al. | |
| 6,960,130 B2 | 11/2005 | Gebke et al. | |
| 7,003,966 B2 | 2/2006 | Sharma | |
| 7,010,392 B2 | 3/2006 | Bash et al. | |
| 7,031,154 B2 | 4/2006 | Bash et al. | |
| 7,035,111 B1 | 4/2006 | Lin et al. | |
| 7,042,722 B2 | 5/2006 | Suzuki et al. | |
| 7,068,505 B2 | 6/2006 | Kosugi | |
| 7,074,123 B2 * | 7/2006 | Bettridge | H05K 7/20736 312/236 |
| 7,112,131 B2 | 9/2006 | Rasmussen et al. | |
| 7,197,433 B2 | 3/2007 | Patel et al. | |
| 7,238,104 B1 | 7/2007 | Greenslade et al. | |
| 7,257,956 B2 | 8/2007 | Shimada et al. | |
| 7,272,001 B2 | 9/2007 | Cheng | |
| 7,278,273 B1 | 10/2007 | Whitted et al. | |
| 7,283,358 B2 | 10/2007 | Campbell et al. | |
| 7,346,913 B2 | 3/2008 | Ishimine et al. | |
| 7,361,081 B2 | 4/2008 | Beitelmal et al. | |
| 7,379,299 B2 | 5/2008 | Walsh et al. | |
| 7,403,385 B2 | 7/2008 | Boone et al. | |
| 7,408,775 B2 | 8/2008 | Walz et al. | |
| 7,434,413 B2 | 10/2008 | Wruck | |
| 7,486,505 B2 | 2/2009 | Fushimi et al. | |
| 7,499,286 B2 | 3/2009 | Berke et al. | |
| 7,500,911 B2 | 3/2009 | Johnson et al. | |
| 7,542,288 B2 | 6/2009 | Lanus | |
| 7,660,116 B2 | 2/2010 | Claassen et al. | |
| 7,660,117 B2 | 2/2010 | Werner et al. | |
| 7,701,710 B2 | 4/2010 | Tanaka et al. | |
| 7,733,666 B2 | 6/2010 | Ichihara et al. | |
| 7,746,634 B2 | 6/2010 | Horn et al. | |
| 7,764,498 B2 | 7/2010 | Conn | |
| 7,768,780 B2 | 8/2010 | Coglitore et al. | |
| 7,768,787 B2 | 8/2010 | Vaughan et al. | |
| 7,804,685 B2 | 9/2010 | Krietzman | |
| 7,821,790 B2 | 10/2010 | Sharma et al. | |
| 7,843,685 B2 | 11/2010 | Beauchamp et al. | |
| 7,869,210 B2 | 1/2011 | Moss | |
| 7,878,888 B2 | 2/2011 | Rasmussen et al. | |
| 7,929,300 B1 | 4/2011 | Bisbikis et al. | |
| 7,944,700 B2 | 5/2011 | Wang et al. | |
| 7,990,700 B2 | 8/2011 | Guo | |
| 8,087,979 B2 | 1/2012 | Rasmussen | |
| 8,154,870 B1 | 4/2012 | Czamara et al. | |
| 2001/0029163 A1 | 10/2001 | Spinazzola et al. | |
| 2002/0021557 A1 | 2/2002 | Ishimine et al. | |
| 2002/0100736 A1 | 8/2002 | Lopez | |
| 2002/0134531 A1 | 9/2002 | Yanagida | |
| 2002/0181194 A1 | 12/2002 | Ho et al. | |
| 2003/0156385 A1 | 8/2003 | Askeland et al. | |
| 2004/0020224 A1 | 2/2004 | Bash et al. | |
| 2004/0032722 A1 | 2/2004 | Wrycraft et al. | |
| 2004/0165349 A1 | 8/2004 | Arbogast et al. | |
| 2004/0218355 A1 | 11/2004 | Bash et al. | |
| 2005/0040779 A1 | 2/2005 | Frankel et al. | |
| 2005/0135069 A1 | 6/2005 | King et al. | |
| 2005/0166860 A1 | 8/2005 | Austin et al. | |
| 2005/0188689 A1 | 9/2005 | Juby et al. | |
| 2005/0228618 A1 | 10/2005 | Patel et al. | |
| 2005/0237716 A1 | 10/2005 | Chu et al. | |
| 2005/0257232 A1 | 11/2005 | Hidaka | |
| 2005/0265004 A1 | 12/2005 | Coglitore et al. | |
| 2005/0281014 A1 | 12/2005 | Carullo et al. | |
| 2006/0059937 A1 | 3/2006 | Perkins et al. | |
| 2006/0061955 A1 | 3/2006 | Imblum | |
| 2006/0250766 A1 | 11/2006 | Blaalid et al. | |
| 2006/0274496 A1 | 12/2006 | Lee et al. | |
| 2006/0290245 A1 | 12/2006 | Hidaka | |
| 2007/0053169 A1 | 3/2007 | Carlson et al. | |
| 2007/0058336 A1 | 3/2007 | Cheng | |
| 2007/0074525 A1 | 4/2007 | Vinson et al. | |
| 2007/0076369 A1 | 4/2007 | Chen et al. | |
| 2007/0101746 A1 | 5/2007 | Scholm et al. | |
| 2007/0159790 A1 | 7/2007 | Coglitore et al. | |
| 2007/0213000 A1 * | 9/2007 | Day | H05K 7/20745 454/184 |
| 2007/0217172 A1 | 9/2007 | Bisbikis et al. | |
| 2007/0223200 A1 | 9/2007 | Fujiya et al. | |
| 2007/0240433 A1 | 10/2007 | Manole | |
| 2008/0013275 A1 | 1/2008 | Beckley et al. | |
| 2008/0029250 A1 | 2/2008 | Carlson et al. | |
| 2008/0037209 A1 | 2/2008 | Niazi et al. | |
| 2008/0043427 A1 | 2/2008 | Lee et al. | |
| 2008/0055846 A1 | 3/2008 | Clidaras et al. | |
| 2008/0094797 A1 | 4/2008 | Coglitore et al. | |
| 2008/0112127 A1 | 5/2008 | June et al. | |
| 2008/0158813 A1 | 7/2008 | Yin | |
| 2008/0191590 A1 | 8/2008 | Lin et al. | |
| 2008/0232064 A1 | 9/2008 | Sato et al. | |
| 2008/0259566 A1 | 10/2008 | Fried | |
| 2008/0285232 A1 | 11/2008 | Claassen et al. | |
| 2008/0305733 A1 | 12/2008 | Noteboom et al. | |
| 2009/0061755 A1 | 3/2009 | Calder et al. | |
| 2009/0086441 A1 | 4/2009 | Randall et al. | |
| 2009/0097200 A1 | 4/2009 | Sharma et al. | |
| 2009/0109609 A1 | 4/2009 | Lai et al. | |
| 2009/0122505 A1 | 5/2009 | Lu | |
| 2009/0237877 A1 | 9/2009 | Honda et al. | |
| 2009/0257187 A1 | 10/2009 | Mills et al. | |
| 2009/0260384 A1 | 10/2009 | Champion et al. | |
| 2009/0296322 A1 | 12/2009 | Yang et al. | |

(56) References Cited

U.S. PATENT DOCUMENTS

| | | |
|---|---|---|
| 2009/0321105 A1 | 12/2009 | Sawyer |
| 2010/0024445 A1 | 2/2010 | Cichanowicz |
| 2010/0048121 A1* | 2/2010 | Klopfenstein ............ F24F 7/10 454/186 |
| 2010/0091458 A1 | 4/2010 | Mosier et al. |
| 2010/0112925 A1* | 5/2010 | Schmitt ............ H05K 7/20745 454/184 |
| 2010/0149754 A1 | 6/2010 | Chapel et al. |
| 2010/0271766 A1 | 10/2010 | Lin |
| 2011/0149508 A1 | 6/2011 | Malekmadani |
| 2011/0284422 A1 | 11/2011 | Yamada |
| 2011/0288664 A1* | 11/2011 | Archibald ............... G06F 1/206 700/90 |
| 2012/0014060 A1* | 1/2012 | Slessman ........... H05K 7/20736 361/691 |
| 2012/0092811 A1 | 4/2012 | Chapel et al. |
| 2012/0142265 A1* | 6/2012 | Wei .................... H05K 7/20745 454/184 |
| 2013/0052936 A1* | 2/2013 | Jordan ................... F24F 13/14 454/338 |
| 2014/0014292 A1 | 1/2014 | Rice et al. |

FOREIGN PATENT DOCUMENTS

| | | |
|---|---|---|
| EP | 2053911 | 4/2009 |
| EP | 2202751 | 6/2010 |
| JP | 2010-86450 | 4/2010 |
| WO | 9834450 | 8/1998 |
| WO | 2008143503 | 11/2008 |

OTHER PUBLICATIONS

U.S. Appl. No. 12/751,206, filed Mar. 31, 2010, Michael W. Schrempp.
U.S. Appl. No. 12/751,209, filed Mar. 31, 2010, Michael P. Czamara.
U.S. Appl. No. 12/163,146, filed Jun. 27, 2008, Osvaldo P. Morales.
U.S. Appl. No. 12/893,813, filed Sep. 29, 2010, Richard C. Towner.
U.S. Appl. No. 11/535,180, filed Sep. 26, 2006, Osvaldo P. Morales.
U.S. Appl. No. 12/886,437, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
U.S. Appl. No. 11/956,849, filed Dec. 14, 2007, Osvaldo P. Morales.
U.S. Appl. No. 12/646,417, filed Dec. 23, 2009, Michael P. Czamara.
U.S. Appl. No. 12/341,137, filed Dec. 28, 2008, Jonathan David Hay.
U.S. Appl. No. 12/886,440, filed Sep. 20, 2010, Peter GRoss et al.
U.S. Appl. No. 13/103,860, filed May 9, 2011, Michael P. Czamara.
U.S. Appl. No. 13/569,057, filed Aug. 7, 2012, Michael P. Czamara.

* cited by examiner

SYSTEM FOR SUPPLYING COOLING AIR FROM SUB-FLOOR SPACE

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some known data centers include methods and apparatus that facilitate waste heat removal from rack systems. Many existing methods and apparatus may not, however, provide air for cooling in an effective manner to where it is most needed. Moreover, some known data centers include multiple rack systems having configurations that are non-uniform with respect to component density and usage, such that each rack system generates waste heat at a non-uniform rate as compared to other rack systems. In such data centers, application of uniform heat removal methods and apparatus to such non-uniform waste heat generation sources may not be fully efficient and effective in waste heat removal.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of air directing devices, and systems and methods using conduits, are disclosed. According to one embodiment, According to one embodiment, a system for performing computing operations includes a computing room having a raised floor, a sub-floor space under the raised floor, rack computing systems in the computing room, and one or more conduits. The rack computing systems may include a rack including rack air inlets and computing devices in the rack. The conduits may include one or more passageways, an inlet portion, and one or more exits. The conduit may couple with an opening in the raised floor. The inlet portion of the conduit may receive air from the sub-floor space and pass the air to the passageways. The exits may direct air from the passageways through rack air inlets of the rack computing systems.

According to one embodiment, a system for providing air to electrical systems includes a conduit having a passageway, an inlet portion, and one or more exits. The conduit may couple with an opening in the raised floor. The inlet portion of the conduit may receive air from the sub-floor space and pass the air to the passageway. The exits may direct air from the passageway through rack air inlets of a rack computing system.

According to one embodiment, a method of providing air from below a floor in a room to a rack computing system in the room includes conveying air from a sub-floor space below the floor into a conduit. The conduit may segregate the air in the conduit from air in an aisle of the room. Air from the conduit is directed through a rack air inlet of the rack computing system.

As used herein, "air handling system" means a system that provides or moves air to, or removes air from, one or more systems or components.

As used herein, an "aisle" means a space next to one or more racks.

As used herein, "ambient" refers to a condition of outside air at the location of a system or data center.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "conduit" means a tube, pipe, duct, sleeve, or any device, apparatus, element, or portion thereof, that includes a passageway through which something, such as a fluid, can be conveyed. Examples of materials for a conduit include cloth, fabric, extruded metal, sheet metal, a polymer, or a combination thereof. A passageway of a conduit may have any size and shape. A passageway may have a constant or changing cross section or a cross section that changes over the length of the passageway. The cross sectional shape of a passageway of a conduit may be square, rectangular, round or irregular, and may be uniform or change over the length of the conduit. A conduit may be a separately produced component or integral with one or more other components, such as a frame or mounting base.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "rack" means a rack, container, frame, or other element or combination of elements that can contain or physically support one or more computer systems.

As used herein, "rack computing system" means a system that includes one or more computing devices mounted in a rack.

As used herein, "room" means a room or a space of a building. As used herein, "computing room" means a room of a building in which computing devices, such as rack-mounted servers, can be operated.

As used herein, "room" means a room or a space of a building. As used herein, "computer room" means a room of a building in which computer systems, such as rack-mounted servers, are operated.

As used herein, a "space" means a space, area or volume.

Figure 1:
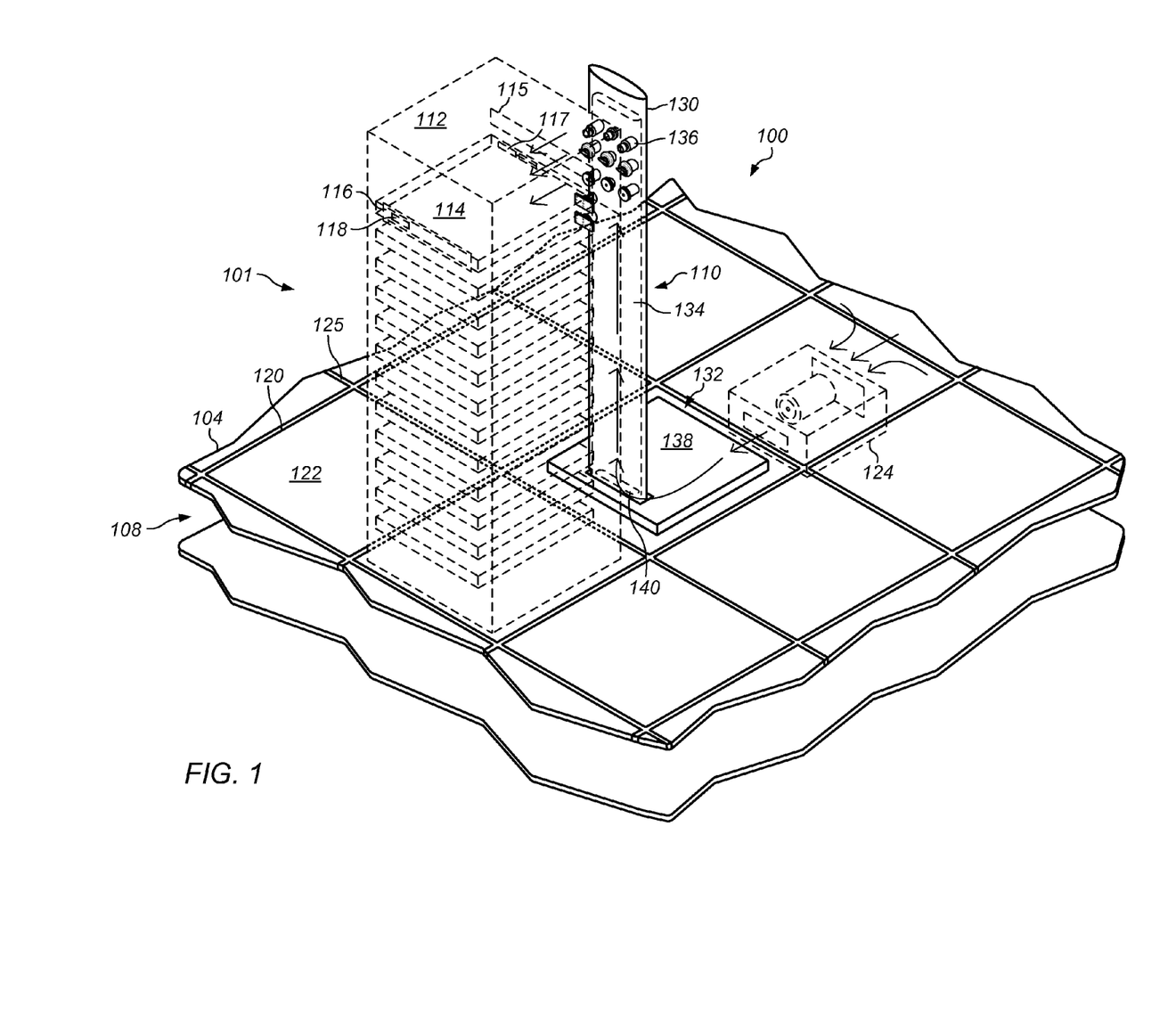
FIG. 1 illustrates one embodiment of a data center with a conduit that can direct air from a sub-floor space to rack air inlets.

In some embodiments, a system includes a conduit that conveys air from a sub-floor space through rack air inlets of a rack computing system. FIG. 1 illustrates one embodiment of a data center with a conduit that can direct air from a sub-floor space to rack air inlets. Data center 100 includes computing room 101, rack computing system 102, raised floor 104, and base floor 106. A Sub-floor space 108 is formed between raised floor 104 and base floor 106. Conduit 110 is located on raised floor 104 in front of rack computing system 102. In some embodiments, rack computing systems in a data center are implemented in pods. Each pod may include a set of rack computing systems, enclosure, and supported data center infrastructure (for example, air handling units, UPSs, power distribution units).

Rack computing system 102 may be deployed in computing room 101 of data center 100. Rack computing system 102 includes rack 112 and computing devices 114. Computing devices 114 may be operated to perform computing operations in the data center. Rack 112 is supported on raised floor 104. In certain embodiments, rack 112 is secured to raised floor 104 by way of anchor brackets. Rack 112 includes rack air inlets 115 and rack air exits 116. Computing devices 114 include computing device air inlets 117 and computing device air exits 118.

Raised floor 104 includes grid 120 and tiles 122. Grid 120 includes frame members 125. Frame members 125 may be supported on posts, columns, beams, or other structural elements. Tiles 122 are installed in openings in grid 120.

Data center 100 includes air handling system 124. Air handling system 124 moves air through computing room 101 and rack computing system 102. Air handling system 124 may be, in one embodiment, a computer room air conditioning unit ("CRAC"). In some embodiments, sub-floor space 108 serves as a cooling air plenum. Air handling system 124 may increase air pressure in sub-floor space 108 such that air flows through floor vents in tiles 122 in computing room 101, as indicated by the arrows.

Conduit system 110 includes conduit tower 130, tower base 132, passageway 134, and nozzles 136. Tower base 132 includes tower base frame 138 and tower air inlet 140. Conduit tower 130 may be supported on tower base frame 138. Tower air inlet 140 may be located at an opening in raised floor 104 (for example, a hole or vent in one of tiles 122). Air from sub-floor space 108 may flow into passageway 134 by way of tower air inlet 140. Air from passageway 134 of conduit system 110 may be directed into rack 112. Air may flow from front to back of rack computing system 102.

Nozzles 136 are mounted on conduit tower 130. Air from conduit system 110 may pass through rack 112 and computing devices 114 from front to back of rack computing system 102. Nozzles 136 may be located at positions that correspond to rack air inlets 115 of rack 112. In one embodiment, a nozzle is included for each rack position in which a server is installed. For example, if a rack includes 1U servers, a nozzle may be included a conduit tower 130 for a rack air inlet corresponding to each of the servers.

In some embodiments, a conduit includes nozzles at only some of the rack positions in which servers are installed. For example, a tower may include a nozzle at every other rack slot, or every third rack slot.

For illustrative purposes, only one rack computing system and one conduit is shown in FIG. 1. A data center may, however, include any number of racks and any number of conduits. In some embodiments, rack computing systems are arranged in one or more rows in a computing room. A conduit may be provided for some or all of the racks in each row in the computing room.

Tower base 132 is supported on raised floor 104. In some embodiments, conduit 110 is bolted to one of tiles 122 (for example, by way of holes in tile 122). Holes may be pre-drilled or pre-formed in a tile (for example, prior to being shipped to the data center). In other embodiments, holes for a conduit are drilled on-site at the data center (for example, at the time the conduit is installed on the raised floor.)

Figure 2:
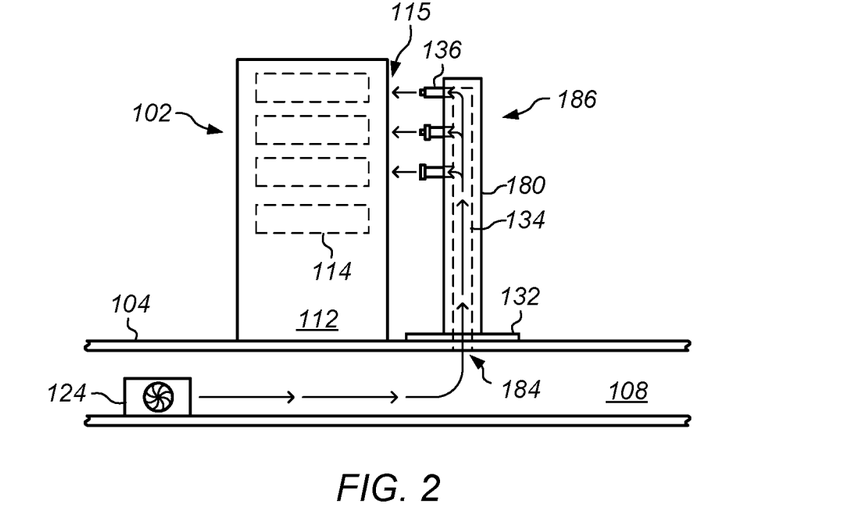
FIG. 2 is a side view illustrating a conduit that can supply air to inlets on the front of a rack computing system.

FIG. 2 is a side view illustrating a conduit that can supply air to inlets on the front of a rack computing system. Conduit system 110 is positioned in front a rack computing system 102. Pressure in sub-floor space 108 may move air from sub-floor space 108 into passageway 134. Air from passageway 134 may be expelled from passageway 134 through nozzles 136 into rack 112.

In the embodiment illustrated in FIG. 2, there is a gap between the front edge of nozzles 136 and rack air inlets 115. Nozzles 136 may direct air into rack air inlets 115. In some embodiments, air exits of a conduit may be in contact with the front of the rack. In certain embodiments, an air exit from a conduit may be sealed on a rack air inlet.

For example, the connection between a conduit air exit and a rack air inlet may include a gasket seal. In certain embodiments, nozzles on a conduit (such as conduit tower 130) extend into the interior of a rack enclosure (for example, extend rearward beyond the front edge of the enclosure).

Air directing devices, such as nozzles 136, may direct and/or boost the flow of air across or through computer devices in rack. Blanking plates may be provided in slots on front side of rack computing system 102 where air is not to be directed. Vents may be provided in each slot to allow air to flow into rack 112 at the slot.

In some embodiments, the location of conduit air exits may differ from slot-to-slot of a rack system. The locations of conduit air exits may be based on the cooling requirements of the computing devices in the rack. In some embodiments, conduit air exits are provided for computer systems in relatively warm locations in a rack to enhance cooling of such computer systems. For example, a slot near the top of rack system 112, multiple nozzles may be provided because the computing devices may be in a relatively warm location in the rack. Conversely, in slots lower in the rack, no nozzles may be needed because the air in these lower slots in the rack may be relatively cool.

In some embodiments, conduit air exits are located to direct air to desired locations in a particular server. The desired location may be based on the layout of heat producing components of the server. In certain embodiments, a conduit air exit is located at desired location along the width of a slot in which the rack is installed. For example, for a type of server that has a central processing unit on the right side and disk drives on the left side, one or more nozzles may be positioned on the right side of the slot. As another example, for a type of server that has sensitive electronic components on the right side and left side of the server and disk drives in the middle, one or more air directing devices may be positioned on each of the left side and right side of the slot.

In various embodiments, air exits having different sizes or characteristics may be used in different locations, depending on cooling requirements of the computing device in the rack. For example, a conduit air exit for a low power server may have a relatively small orifice, while a conduit air exit for a high power server may have a relatively large orifice. In some embodiments, the size and/or position of an opening or nozzle in a conduit may match the size of a corresponding opening in a server. In one embodiment, an opening in a conduit air exit is about 3.5 inches across.

In some embodiments, conduit that directs air into a rack is supported (either partially or completely) on or by a rack. For example, a conduit tower may be hung from rack 112. Suitable elements for mounting a conduit to a rack may include clips, hooks, pins, hook and loop, snaps, screws, clips, or other fasteners.

A conduit for directing air from a sub-floor may be produced by various manufacturing processes, including molding, casting, machining, extruding, or cutting. In one embodiment, an air directing device is injection molded. Suitable materials for a conduit may include a polymer or a metal. In some embodiments, a conduit is produced as a single part, such as by molding, forming, or machining. In other embodiments, an air directing device is an assembly of two or more parts.

Figure 3:
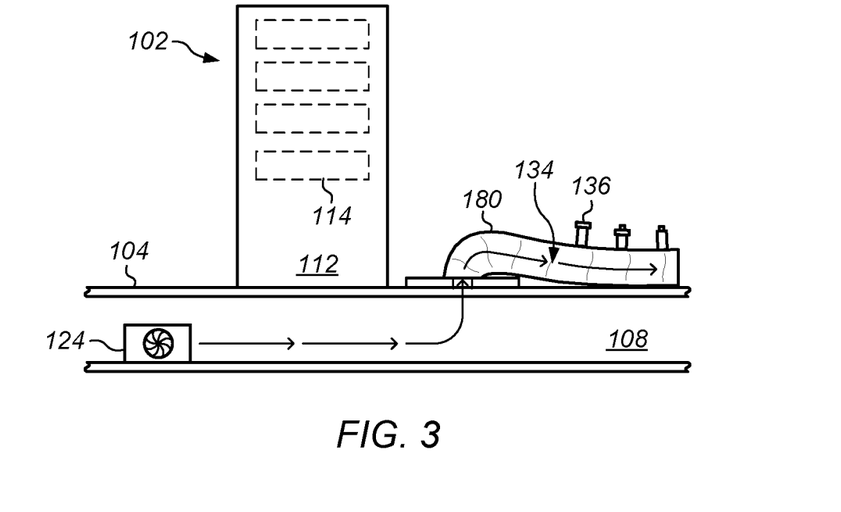
FIG. 3 illustrates one embodiment of a flexible air supply conduit in a partially inflated state.

In some embodiments, a conduit is a made of a flexible material that is inflated under pressure of air introduced into the conduit from a sub-floor space. The FIG. 3 illustrates one embodiment of a flexible air supply conduit in a partially inflated state. When air handling system in a data center is off, conduit 180 may be in an uninflated state (for example, in a collapsed state on floor raised floor 104). Conduit 180 may have predetermined shape or cross section when inflated. For example, the cross section of conduit 180 may be circular, rectangular, square, or ovate. When air handling system 124 is operating, air may flow from sub-floor space 108 through opening 184 in tile 122 into passageway 134 of conduit 180, inflating conduit 180. In some embodiments, the shape and size of conduit 180 is such that, when conduit 180 is fully inflated, nozzles 136 are positioned in desired locations in front of rack computing system 102 (for example, such that each nozzle is aligned with a corresponding air inlet of a server).

Figure 4:
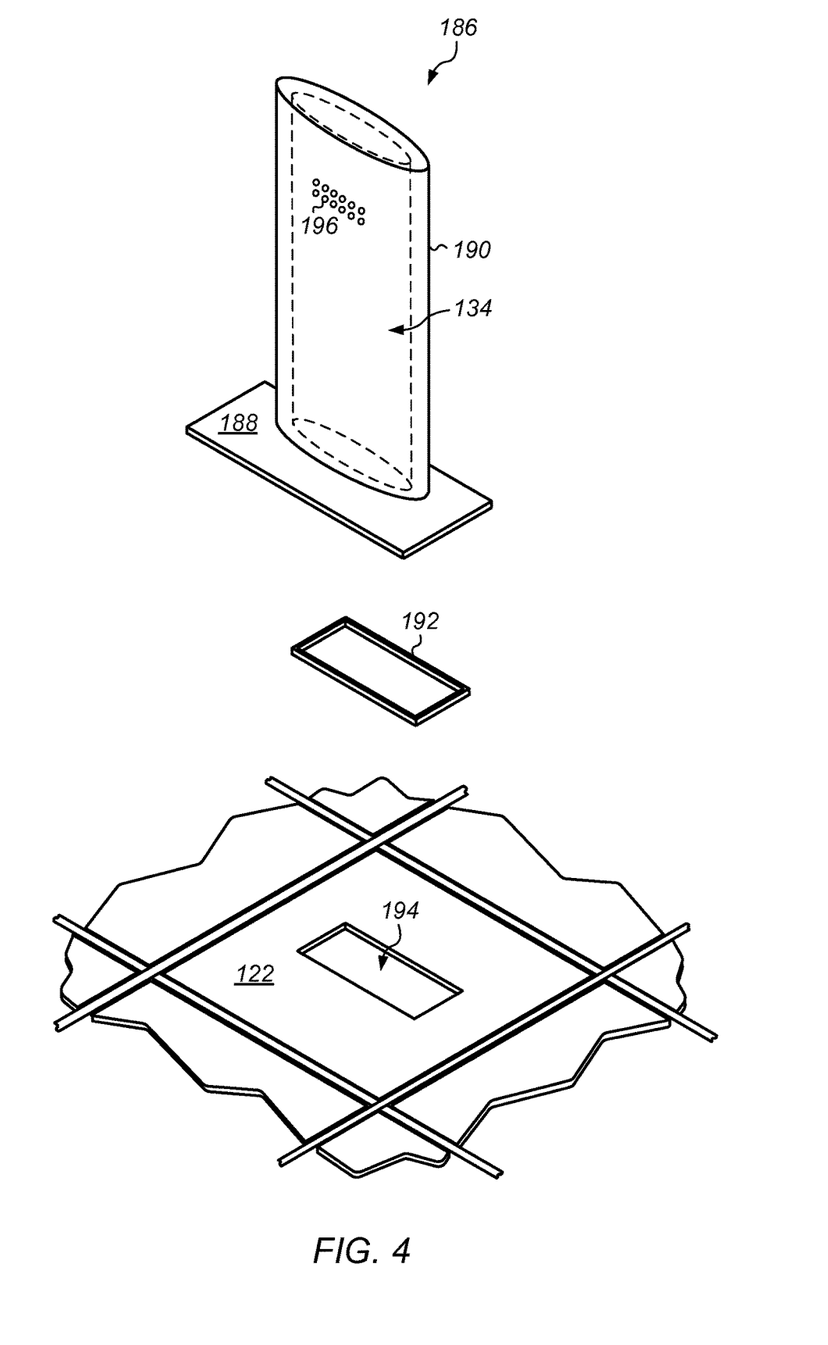
FIG. 4 is an exploded view illustrating one embodiment of system with a conduit that mounts over an opening in a raised floor tile.

FIG. 4 is an exploded view illustrating one embodiment of conduit system with a conduit that mounts over an opening in a raised floor tile. Conduit 186 includes conduit base 188 and conduit tower 190. Gasket 192 may seal a fluid connection between opening 194 in tile 122 and passageway 134 and conduit tower 190. In certain embodiments, tile 122, conduit base 188, or both may include a gland or groove for a seal member, such as gasket 192 or an O-ring. Conduit tower 190 may include air exits 196. Air exits 196 may supply air to racks positioned next to conduit tower 190.

Figures 5, 6, 7, 8:
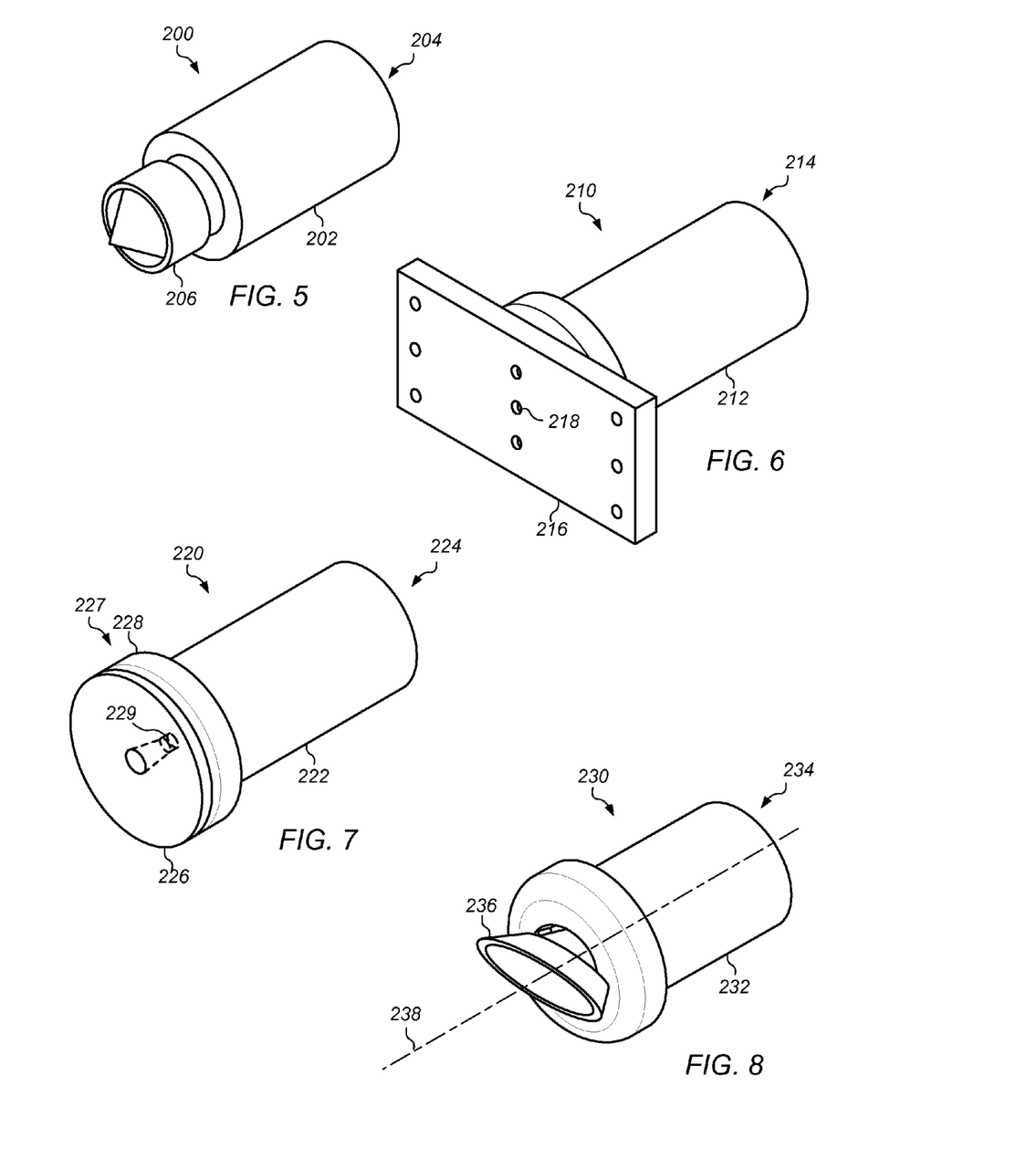
FIG. 5 illustrates one embodiment of a nozzle that can be installed on a conduit tower.
FIG. 6 illustrates one embodiment of nozzle having an array of air exits.
FIG. 7 illustrates one embodiment of an adjustable nozzle that can be installed on a conduit tower.
FIG. 8 illustrates one embodiment of a nozzle that can direct air from a conduit tower an angle relative to the surface of the conduit

Nozzles of a conduit system may have one of various arrangements. FIG. 5 illustrates one embodiment of a nozzle that can be installed on a conduit tower. Nozzle 200 includes nozzle body 202, nozzle inlet 204, and nozzle exit 206. Nozzle exit 206 may direct the flow of air exiting nozzle 202 into a rack.

Nozzles may be connected to a conduit in any manner. Examples of elements for connecting a nozzle include a threaded connection, hook-and-loop, screws, or clips. In certain embodiments, a nozzle is press-fitted or snap-fitted into a socket or receptacle in a conduit.

In some embodiments, a nozzle includes multiple air exits. FIG. 6 illustrates one embodiment of nozzle having an array of air exits. Nozzle 210 includes nozzle body 212, nozzle inlet 214, and nozzle exit 216. Nozzle exit 216 includes an array of openings 218. Openings 218 may direct the flow of air exiting nozzle 212 into a rack.

FIG. 7 illustrates one embodiment of an adjustable nozzle that can be installed on a conduit tower. Nozzle 220 includes nozzle body 222, nozzle inlet 224, and nozzle exit 226. Nozzle exit 226 may direct the flow of air exiting nozzle 222 into a rack.

In some embodiments, an air directing device directs air at an angle. FIG. 8 illustrates one embodiment of a nozzle that can direct air from a conduit tower an angle relative to the surface of the conduit. Nozzle 230 includes nozzle body 232, nozzle inlet 234, and nozzle exit 236. Nozzle body 232 may be installed in a conduit in a horizontal plane. Nozzle 230 may direct air at an angle relative to axis 238.

In some embodiments, the angle or orientation of a nozzle may be adjustable. For example, nozzle exit 236 may be adjustable to reorient nozzle exit 236 about axis 238 to 10 o'clock, 2 o'clock, or 6 o'clock. Also, the angle of nozzle exit 236 relative to axis 238 may be adjustable. For example, nozzle exit 236 may be adjusted from an angle in which air is directed along axis 238, or is directed up, down or sideways relative to axis 238.

In some embodiments, a conduit system includes one or more air flow control devices. Air flow control devices may be operable to vary the flow or air into one or more locations in one or more racks. Air flow control devices may be operated manually, automatically (for example, by a programmable logic controller), or both. In one embodiment, a conduit system includes a flow control device that alters air flow to two or more conduits or racks in a data center. In one embodiment, each tower in a computing room includes a separate flow control device.

In some embodiments, a conduit system includes a mechanism for adjusting air flow from one or more exits of a conduit. In certain embodiments, each nozzle on a conduit tower includes a flow control device. For example, nozzle 220 shown in FIG. 7 includes flow control device 227. Flow control device 227 includes flow valve 229 and sleeve 228. In one embodiment, valve 229 is a needle valve. A user may rotate sleeve 228 to adjust the amount of air passing through valve 229. Examples of other flow control devices that may be used in conduit systems in various embodiments include an adjustment screw, sliding plate, or louvers.

Figure 9:
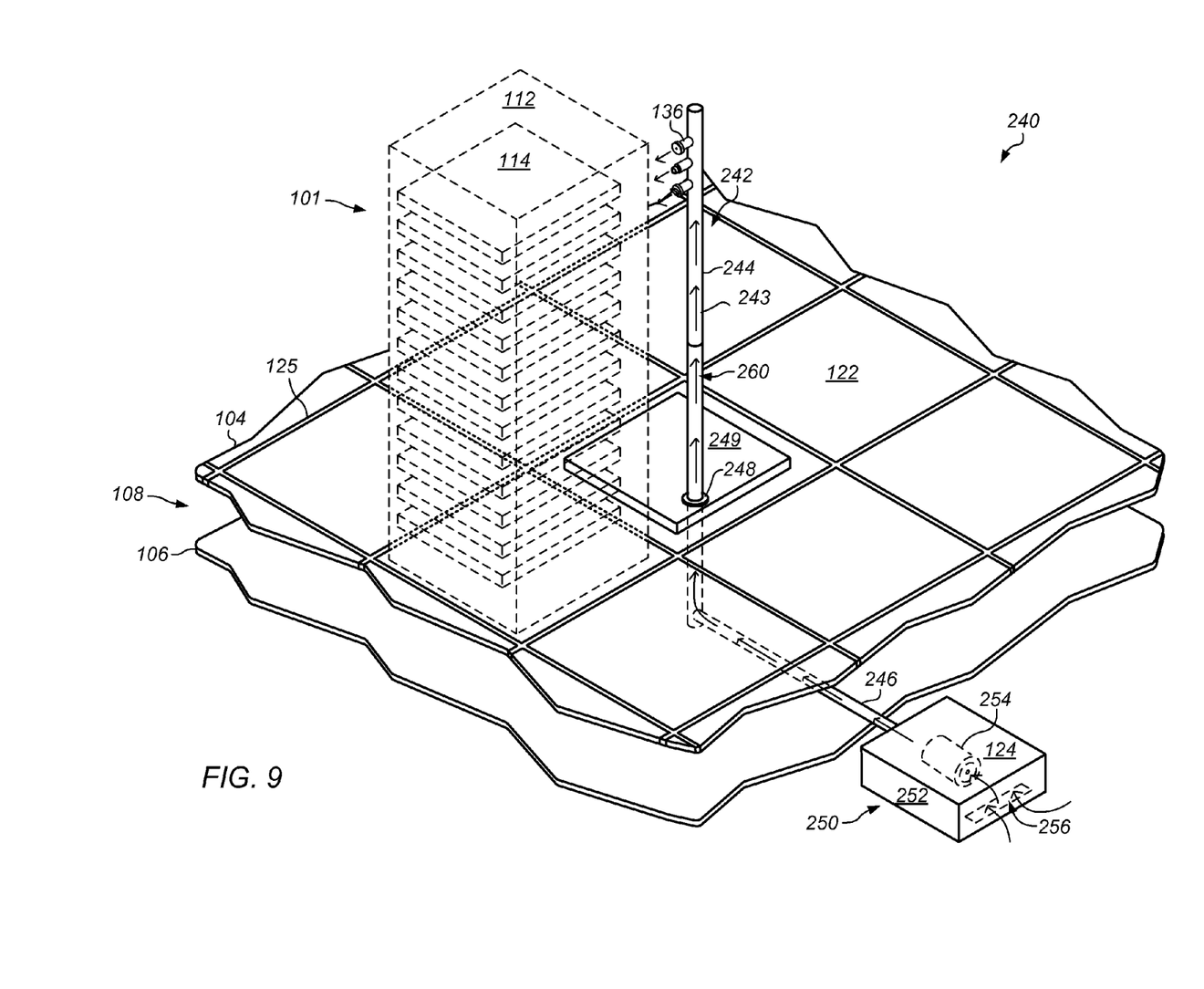
FIG. 9 illustrates one embodiment of a data center with an air moving device that moves air from a sub-floor space through a conduit to supply air to a rack computing system.

FIG. 9 illustrates one embodiment of a data center with an air moving device that moves air from a sub-floor space through a conduit to supply air to a rack computing system. Data center 240 includes computing room 101, rack computing system 102, raised floor 104, base floor 106, air handling system 124, and conduit system 242. Sub-floor space 108 is formed between raised floor 104 and base floor 106.

Conduit system 242 is located on raised floor 104 in front of rack computing system 102. Conduit system 242 includes conduit tower assembly 244, sub-floor supply tube 246, mounting ring assembly 248, and conduit air moving system 250.

Conduit air moving system 250 includes housing 252, air moving device 254, and intake vent 256. Air moving device 254 is mounted in housing 252. Housing 252 may be supported by raised floor 104 (for example, bolted to the bottom of one of tiles 122) or on base floor 106 (for example, on legs resting on the surface of floor base floor 106). In certain embodiments, housing 252 is supported by sub-floor tube 246.

Conduit tower assembly 244 and sub-floor supply tube 246 are coupled to one of tiles 122 with mounting ring assembly 248 and tower base plate 249 at opening 258 in raised floor 104. In some embodiments, mounting ring assembly 248 includes a seal (for example, an elastomeric O-ring). A seal may inhibit leakage between sub-floor space 108 and the space above raised floor 104. In some embodiments, a seal inhibits leakage at a junction between rack-feeding conduit assembly 244 and sub-floor supply tube 246.

Nozzles 136 are attached to conduit tower assembly 244. Nozzles 136 are in fluid communication passageway 243 of conduit tower assembly 244.

Although in the embodiment shown in FIG. 1, conduit system 242 includes nozzles to direct air into rack 112, a conduit system may supply air without the use of nozzles. In one embodiment, for example, a conduit may include holes or apertures that expel air supplied from sub-floor tube 246 into the space in front of rack air inlets.

During operation of rack computing systems 102, air handling system 124 may be operated to introduce air into sub-floor space 108. In some embodiments, air handling system 124 includes one or more computer room air conditioning units (CRACs). Conduit air moving system 250 of conduit system 242 may be operated to draw cooled air from sub-floor space 108 into housing 252 of conduit system 242. Air moving device 254 may move air through sub-floor supply tube 246, through opening 258 in raised floor 104, and into passageway 243 in conduit tower assembly 244. Air may be expelled from passageway 243 under pressure through air exits 261 and directed into inlets in racks 112 and computing devices 114. In some embodiments, nozzles (such as those described above relative to FIGS. 5-8) are installed on one or more of air exits 261.

Figure 10:
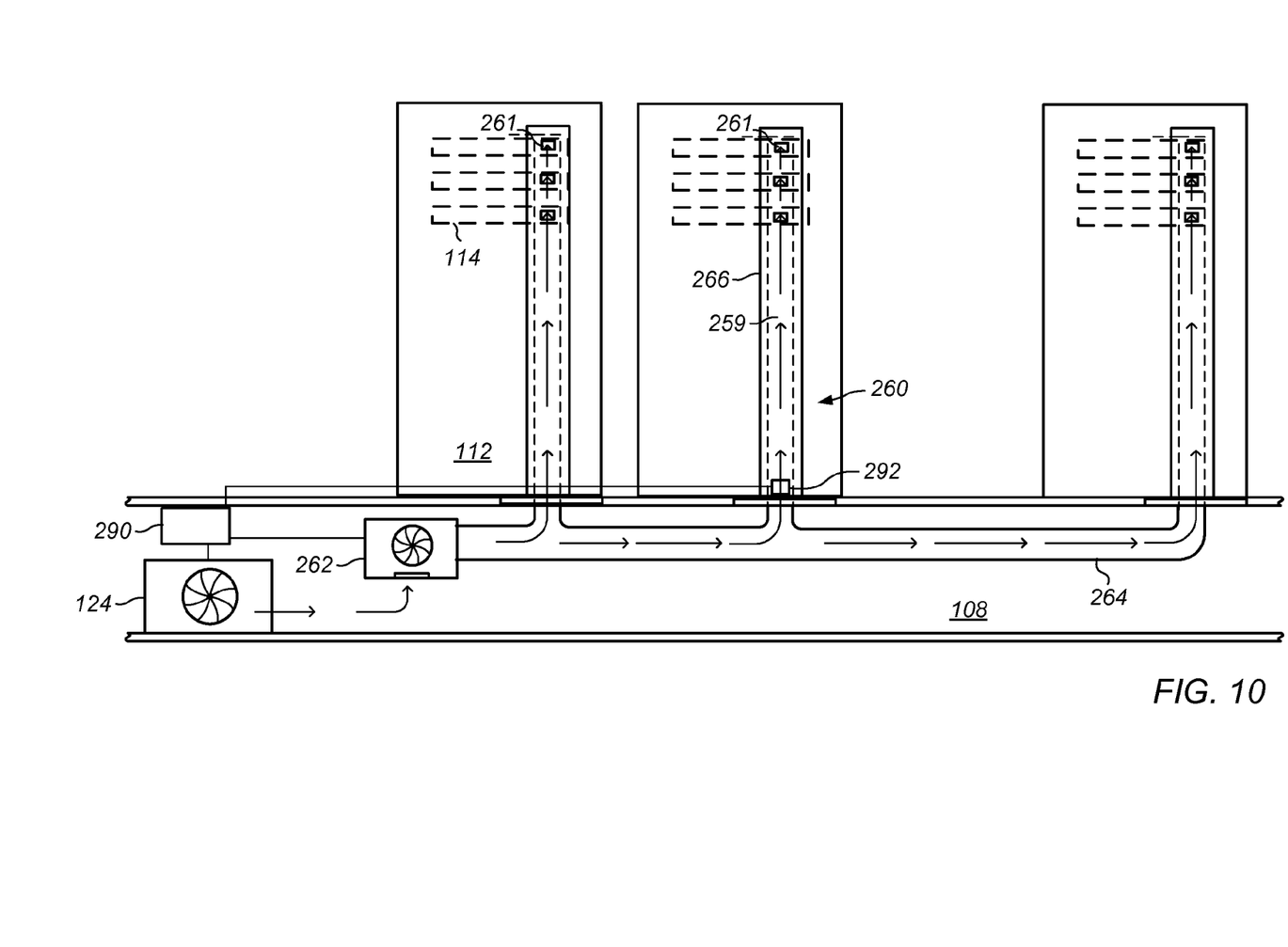
FIG. 10 illustrates one embodiment of a conduit system with multiple towers.

In the embodiment shown in FIG. 10, conduit air moving system 250 is located under raised floor 104. Air moving systems for a conduit may, nevertheless, in some embodiments be located above a raised floor instead of, or in addition, an air moving system below the raised floor. In one embodiment, air moving devices are located in each of two or more towers on the floor a computing room.

In some embodiments, air is moved through computing devices in a rack by air moving devices that are downstream from the computing devices. Air moving devices may be located, for example, in the rear door of a rack, in a hot aisle of a computing room, or in a plenum above a hot aisle.

In some embodiments a conduit system includes branches to supply air from a sub-floor space to multiple rack computing systems. In one embodiment, the conduit system includes a separate tower for each rack computing system. FIG. 10 illustrates one embodiment of a conduit system with multiple towers. Conduit system 260 includes air moving system 262, manifold 264, and conduit towers 266. Conduit towers may be similar to conduit towers described above relative to FIG. 9. Manifold 264 may include tubes that distribute air from air moving system 262 to conduit towers 266. Each of conduit towers 266 may supply air to a different rack computing system (or to a different set of two or more rack computing systems). In certain embodiments, two or more towers are included for a single rack computing system.

In some embodiments, a conduit air moving system includes, or is connected to, a control system. For example, in the embodiment illustrated in FIG. 10, air moving system 262 is connected to control unit 290. Control unit 290 may be coupled to air moving system 262 and flow control device 292. Control unit 290 may control a rate of flow at one or more locations in or from conduit system 260. In some embodiments, air moving system 262 includes a variable frequency drive coupled to control unit 290. Control unit 290 may be vary the speed of an air moving device in air moving system 262 using the variable frequency drive.

In certain embodiments, control unit 290 includes at least one programmable logic controller. The PLC may, among other things, open and close valves or dampers in conduit systems based upon command signals from an operator to channel air flow through a data center or in various locations in a conduit system as necessary for the prevailing operational conditions. In certain embodiments, the PLC may modulate valves and dampers between fully open and fully closed positions to modulate airflow.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air the mixing plenum.

In various embodiments, operation of one or more conduit sub-systems that supply air from a subfloor space may be controlled in response to one or more conditions. For example, control unit 290 may be programmed to increase or decrease air flow rates in a rack computing system based on predetermined conditions, such as temperature and humidity, are measured in the rack.

In some embodiments, some or all of servers in rack computing systems include internal fans. The internal fans may promote the flow of air through the rack. In other embodiments, none of the servers in a rack have internal fans.

In some embodiments, an air moving device of a conduit system, a variable flow device of a conduit system, or both, are adjusted based on flow rates of other air moving devices in a system. For example, air flow through a nozzle of a conduit system may be adjusted to be optimized relative to operation of an internal fan in a server that receives air from the nozzle. As another example, the speed of an air moving device of a conduit system may be selected to match blower system that draws air through a rack computing system that receives air from the conduit system.

Figure 11:
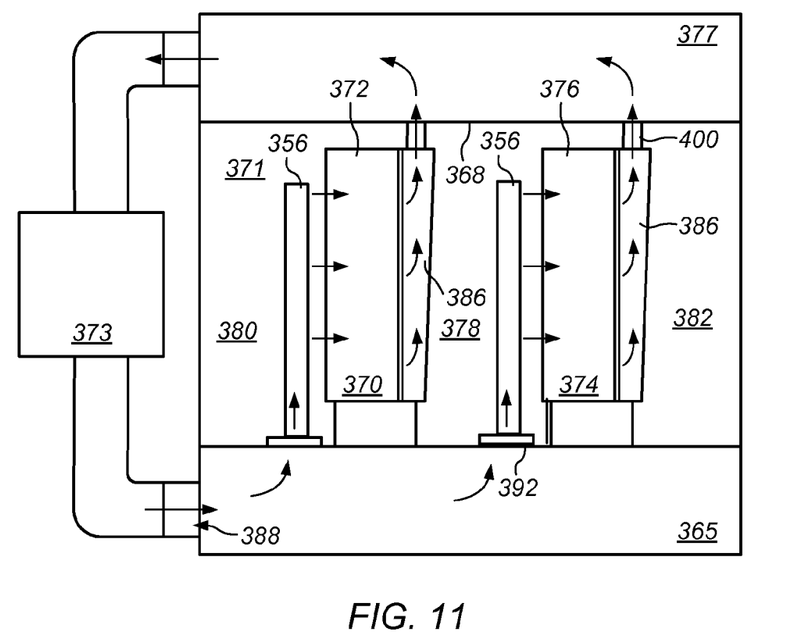
FIG. 11 illustrates a schematic end view of one embodiment of a data center with conduits to supply air to the fronts of rows of rack computing systems.

In some embodiments, a data center having multiple rack systems includes conduit systems that supply air from a sub-floor space to one or more rows of rack computing systems. The conduit systems may segregate air entering the rack computing systems from air spaces in the data center and/or air passing through other rack systems in the data center. In some embodiments, an air directing device segregates air exiting a rack system in a row of rack systems from air in an aisle adjacent to the row. FIG. 11 illustrates a schematic end view of one embodiment of a data center with conduits to supply air to the fronts of rows of rack computing systems. Data center 381 includes computer room 371, air handling system 373, subfloor chamber 365, and plenum 377. Plenum 377 is above ceiling 379 of computer room 362.

Computer room 371 includes rack systems 370 in row 372, and rack systems 374 in row 376. Aisle 378 is formed between rows 372 and row 376. Aisles 380 and 382 are formed between the walls of computer room 371 and rows 372 and 376, respectively. Rack systems 370 and 374 are provided with conduit towers 356 on the inlet side of the racks and air directing devices 386 on the exit side of the racks. Air directing devices 386 may be, in one embodiment, ducts that convey air from exits of a rack to a ceiling plenum.

To remove heat from servers in rack systems 370 and 374, air handling system 373 may be operated to cause air to flow in computer room 371 and through rack systems 370 and 374. Air may be forced into sub floor chamber 365 through opening 388. Air from subfloor chamber 365 may pass into computer room 371 through conduit systems 356. Conduit systems 356 may direct air into rack systems 370 through the front side of row 372. Conduit systems 356 may include scoops similar to those described above with respect to FIGS. 1-10. Air from vent 392 may flow into aisle 378. Conduit systems 156 may direct air into rack systems 374 through the front side of row 376.

Air may flow through servers in rack systems 370 and 374 and into air directing devices 386. Heated air in air directing devices 386 may be channeled through connecting ducts 400 to plenum 377. Air directing devices 386 on rack systems 370 of row 372 may segregate heated air exiting rack systems 370 from the air in aisle 378. Segregating exit air from air in aisle 378 may avoid pre-heating of air entering rack systems 374 in adjacent row 376.

In certain embodiments, different rack systems in the same row have different airflow configurations. In certain embodiments, a conduit system may segregate heated air exiting one rack system in a row from incoming air from a sub-floor space for other rack systems in the same row.

Figure 12:
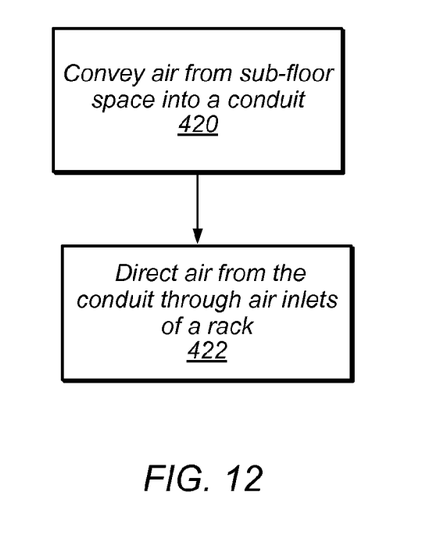
FIG. 12 illustrates one embodiment of providing air from sub-floor space to an inlet of a rack computing system by way of a conduit.

In an embodiment, providing air from below a floor in a room to a rack computing system in the room includes conveying air from a sub-floor space through a conduit. FIG. 12 illustrates one embodiment of providing air from subfloor space to an inlet of a rack computing system by way of a conduit. At 420, air is conveyed from a sub-floor space below a floor of a room into a conduit. The conduit may segregate the air in the conduit from air in an aisle of the room (for example, an aisle next to a row of one or more rack computing systems). In some embodiments, an opening is cut in a tile of a raised floor to introduce air from the sub-floor space.

At 422, air from the conduit is directed through a rack air inlet of the rack computing system. In some embodiments, air from the conduit is directed through one or more nozzles attached to the conduit. The nozzles may be adjusted to increase, decrease, or redirect the flow of air to various computing devices in the rack.

In some embodiments, air flow through one or more openings in a conduit is controlled (for example, increased or decreased) based on characteristics of the computing devices or air moving systems in a computing room, the air in the rack computing systems, or air in the room. In some embodiments, air flow through one or more portions of a conduit is controlled based on measured characteristics (for example, an air temperature or flow rate measured in one of the rack computing systems). In some embodiments, the conduit includes two or more portions or sections.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for performing computing operations, comprising:
   a computing room comprising a raised floor;
   a sub-floor space under the raised floor;
   one or more rack computing systems in the computing room, wherein at least one of the rack computing systems comprises:
      a rack comprising one or more rack air inlets; and
      one or more computing devices in the rack;
   one or more conduits, wherein at least one of the conduits comprises:
      one or more passageways;
      one or more inlet portions configured to couple with one or more openings in the raised floor, wherein at least one of the inlet portions is configured to receive air from the sub-floor space and pass at least a portion of the air to at least one passageway of the one or more passageways; and
      a plurality of nozzles connected to the at least one passageway of the one or more passageways and configured to direct air out of the at least one passageway across at least one gap to at least one rack air inlet of at least one of the rack computing systems, wherein a particular nozzle of the plurality of nozzles has an exit cross-sectional area that is smaller than an inlet cross-sectional area of the particular nozzle and a particular exit orifice having a particular exit orifice cross-sectional shape, and the particular nozzle is configured to provide a particular airflow pattern to a particular position of a particular rack computing system, wherein a different nozzle of the plurality of nozzles is configured to provide a different airflow pattern to a different position of the particular rack computing system, and wherein the different nozzle has a different exit orifice having a different exit orifice cross-sectional shape that differs from the particular cross-sectional shape of the particular nozzle.

2. The system of claim 1, wherein the one or more conduits are separate from the one or more rack computing systems.

3. The system of claim 1, further comprising an air moving device coupled to at least one of the conduits, wherein the air moving device is configured to draw air from the sub-floor space and move at least a portion of the air through at least one of the passageways.

4. The system of claim 1, wherein at least a portion of at least one of the conduits is configured to inflate from air in at least one of the passageways, wherein at least one of the plurality of nozzles is configured to direct air into the at least one rack air inlet when the at least a portion of the conduit is inflated.

5. A system for providing air to electrical systems in a rack, comprising:
   a conduit comprising:
      one or more passageways;
      one or more inlet portions configured to couple with one or more openings in a raised floor, wherein at least one of the inlet portions is configured to receive air from a sub-floor space and pass at least a portion of the air to at least one of the passageways; and
      a plurality of nozzles connected to the at least one passageway of the one or more passageways and configured to direct air out of the at least one passageway across at least one gap to one or more rack air inlets of the rack, wherein a particular nozzle of the plurality of nozzles has an exit cross-sectional area that is smaller than an inlet cross-sectional area of the particular nozzle and a particular exit orifice having a particular exit orifice cross-sectional shape, and the particular nozzle is configured to provide a particular airflow pattern to a particular position of a particular rack computing system, wherein a different nozzle of the plurality of nozzles is configured to provide a different airflow pattern to a different position of the particular rack computing system, and wherein the different nozzle has a different exit orifice having a different exit orifice cross-sectional shape that differs from the particular cross-sectional shape of the particular nozzle.

6. The system of claim 5, further comprising an air moving device coupled to the conduit, wherein the air moving device is configured to move air through at least one of the passageways.

7. The system of claim 6, wherein the air moving device is below the raised floor.

8. The system of claim 5, wherein at least a portion of the conduit is configured to inflate from air in at least one of the passageways, wherein at least one of the plurality of nozzles is configured to direct air into the at least one of the rack air inlets when the at least a portion of the conduit is inflated.

9. The system of claim 5, wherein at least a portion of the conduit is made of a fabric.

10. The system of 5, further comprising a variable flow device, wherein the variable flow device is operable to change a rate of air flow through the particular nozzle based on operation of an internal fan of a server that is configured to receive air from the particular nozzle, and wherein the server is supported by the rack.

11. The system of claim 5, wherein each of at least two of the plurality of nozzles is configured to direct air to a different rack air inlet.

12. The system of claim 5, further comprising a seal configured to inhibit leakage of air passing from the sub-floor space into the conduit.

13. The system of claim 5, wherein the conduit comprises a plurality of branches, wherein each of at least two of the branches is configured to direct air into rack air inlets of a different rack than at least one other of the branches.

14. The system of claim 5, further comprising a controller coupled to an air moving device or at least one variable flow device, wherein the controller is operable to change a rate of air flow through at least one of the plurality of nozzles.

15. The system of claim 5, further comprising at least one flow control device configured to cause air to flow through the particular nozzle at a particular rate and to cause the air to flow through the different nozzle at a different rate.

16. A method of providing air from below a floor in a room to a rack computing system in the room, comprising:
   conveying air from a sub-floor space below the floor into a conduit, wherein the conduit is configured to at least partially segregate the air in the conduit from air in an aisle of the room; and
   directing, via a plurality of nozzles coupled to the conduit, at least a portion of the air out of the conduit across a gap to a rack air inlet of the rack computing system, wherein a particular portion of the air is directed via a particular nozzle with an exit cross-sectional area smaller than an inlet orifice cross-sectional area of the particular nozzle having a particular exit orifice with a particular exit orifice cross-sectional shape, and wherein a different portion of the air is directed at a different portion of the rack via a different nozzle that has a different exit orifice with a different exit orifice cross-sectional shape that differs from the particular cross-sectional shape of the particular nozzle.

17. The method of claim 16, further comprising pressurizing at least portion of the air in the sub-floor space relative to ambient air in the room.

18. The method of claim 16, wherein conveying air from the sub-floor space comprises drawing the air from the sub-floor space into the conduit and forcing at least a portion of the air drawn from the sub-floor space into the conduit.

19. The method of claim 16, further comprising controlling a flow rate through at least a portion of the conduit based on one or more characteristics of air in the rack computing system or the room.

20. The method of claim 16, wherein conveying air from the sub-floor space below the floor comprises:

cutting an opening in a tile in the floor; and
coupling the conduit with the opening such that at least a portion of air that moves through the opening is conveyed through the conduit to the rack air inlet.

21. The system of claim 1, wherein the sub-floor space comprises a sub-floor plenum, the system further comprising one or more air moving devices configured to pressurize the sub-floor plenum, wherein the at least one inlet portion is configured to receive air from the sub-floor plenum.

22. The system of claim 5, wherein the particular nozzle includes multiple air exits, each air exit having a corresponding exit cross-sectional area and the particular nozzle exit cross-sectional area comprises a sum of exit cross-sectional areas of the multiple air exits.

23. The system of claim 5, wherein the particular nozzle is configured to direct air at an angle relative to a direction perpendicular from a surface of the conduit.

24. The system of claim 5, wherein the particular nozzle is configured to have an adjustable angle of orientation.

* * * * *